(12) United States Patent
Bao et al.

(10) Patent No.: US 10,020,254 B1
(45) Date of Patent: Jul. 10, 2018

(54) INTEGRATION OF SUPER VIA STRUCTURE IN BEOL

(71) Applicant: International Business Machines Corporation, Armonk, NY (US)

(72) Inventors: Ruqiang Bao, Niskayuna, NY (US); Joe Lee, Albany, NY (US); Yann Mignot, Slingerlands, NY (US); Hosadurga Shobha, Niskayuna, NY (US); Junli Wang, Albany, NY (US); Yongan Xu, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/727,956

(22) Filed: Oct. 9, 2017

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76804* (2013.01); *H01L 21/76816* (2013.01); *H01L 21/76879* (2013.01); *H01L 23/53228* (2013.01)

(58) Field of Classification Search
CPC .......... H01L 23/5226; H01L 21/76804; H01L 21/76816
See application file for complete search history.

(56) References Cited

U.S. PATENT DOCUMENTS

| | | | |
|---|---|---|---|
| 7,071,097 B2 | 7/2006 | Colburn | |
| 7,312,524 B2 | 12/2007 | Gates et al. | |
| 7,620,926 B1 | 11/2009 | Tuan | |
| 8,093,099 B2 | 1/2012 | Purushothaman et al. | |
| 8,143,159 B2 | 3/2012 | King et al. | |
| 8,668,835 B1 | 3/2014 | Indrakanti et al. | |
| 8,906,801 B2 | 12/2014 | Richter et al. | |
| 9,330,974 B2 | 5/2016 | Kim et al. | |

OTHER PUBLICATIONS

Tian, et al., "Simultaneous Through-Silicon via and Large Cavity Formation Using Deep Reactive Ion Etching and Aluminum Etch-Stop Layer," Electonic Components and Technology Conference (IEEE 2008); pp. 1787-1792.

List of IBM Patents or Patent Applications Treated as Related; (Appendix P), Date Filed Oct. 31, 2017; 2 pages.

Ruqiang Bao, et al., Pending U.S. Appl. No. 15/798,794 entitled "Integration of Super via Structure in BEOL," filed with the U.S. Patent and Trademark Office on Oct. 31, 2017.

*Primary Examiner* — Errol Fernandes
(74) *Attorney, Agent, or Firm* — Cantor Colburn LLP; Vazken Alexanian

(57) ABSTRACT

Semiconductor devices including super via structures and BEOL processes for forming the same, according to embodiments of the invention, generally include removing selected portions of a nitride cap layer intermediate interconnect levels, wherein the selected portions correspond to the regions where the super via structure is to be formed and where underlying overlay alignment markers are located.

8 Claims, 4 Drawing Sheets

INTEGRATION OF SUPER VIA STRUCTURE IN BEOL

BACKGROUND

The present invention generally relates to fabrication methods and resulting structures for semiconductor devices. More specifically, the present invention relates to the structure and formation of super vias in back end of line (BEOL) processing.

Modern integrated circuits are more complex and dense with every technology generation. With continued efforts toward reduction of feature size, use of multiple-patterning and other advanced lithography techniques have been on the rise. Also, the metal deposition process has been evolving to support continuous technology scaling. Generally, integrated circuits (ICs) include semiconductor devices formed as a configuration of circuits on a semiconductor substrate. A complex network of signal paths will normally be routed to connect the circuit elements distributed on the surface of the substrate. Efficient routing of these signals across the device requires formation of multilevel or multilayered conductive networks, which can be formed using schemes, such as, for example, single or dual damascene wiring structures.

SUMMARY

Embodiments of the present invention are generally directed to semiconductor structures and methods for forming the semiconductor structures. A non-limiting example method of fabricating the semiconductor device including a super via interconnect structure according to embodiments of the invention includes providing a structure including a first interconnect level, a second interconnect level, and a nitride cap layer intermediate the first and second interconnect levels. The first interconnect level includes a first metal conductor within a first layer of dielectric material and a metal alignment marker. The second interconnect level includes a second metal conductor within a second layer of dielectric material and a metal alignment marker, wherein the structure further includes a second nitride cap layer on the second interconnect level. Selected portions of the second nitride cap layer are removed to expose portions of the dielectric material in the second interconnect level, wherein underlying the exposed portions of the dielectric material in the second interconnect level include the first metal conductor and the metal alignment marker in the first interconnect level. A third layer of dielectric material is deposited onto the second interconnect level to form a third interconnect level. The second and third layers of dielectric material are simultaneously patterned to form the super via structure to the first metal conductor in the first interconnect level, and the dielectric material in the third layer to form via structures to the second metal conductor and the at least one metal alignment marker in the second interconnect level. The super via structure and the via structures are filled with a metal conductor.

A non-limiting example method of fabricating a semiconductor device including a super via interconnect structure according to embodiments of the invention includes providing a structure including a first interconnect level, a second interconnect level, a first nitride cap layer intermediate the first and second interconnect levels, and a second nitride cap on the second interconnect level. Selected portions of the second nitride cap layer are removed to expose portions of a dielectric material in the second interconnect level, wherein underlying the exposed portions of the dielectric material in the second interconnect level include a first metal conductor and a metal alignment marker. A layer of dielectric material is deposited onto the second interconnect level to form a third interconnect level, wherein the dielectric material in the third interconnect level is the same as the dielectric material in the second interconnect level. The layer of dielectric material in the third interconnect level is patterned to form via structures spanning the third interconnect level to the metal conductor and the metal alignment marker in the second interconnect level and patterning the layer of dielectric material in the third interconnect level and the layer of dielectric material in the second interconnect level to form a super via structure to the metal conductor in the first interconnect level. The super via structure and the via structures are filled with a metal conductor.

A semiconductor device including a super via structure according to embodiments of the invention includes a plurality of interconnect levels including a metal conductor formed in a dielectric layer, wherein each of the interconnect levels is separated from an adjacent interconnect level with a nitride cap layer. A plurality of via structures electrically couple the metal conductor in a selected interconnect level with a metal conductor in an adjacent interconnect level. At least one super via structure spans two of the plurality of interconnect levels without a landing pad on an intermediate interconnect level, wherein the at least one super via structure is free of a necking profile, has a height that is twice that of the via structure, and has a tapered profile the same as the via structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
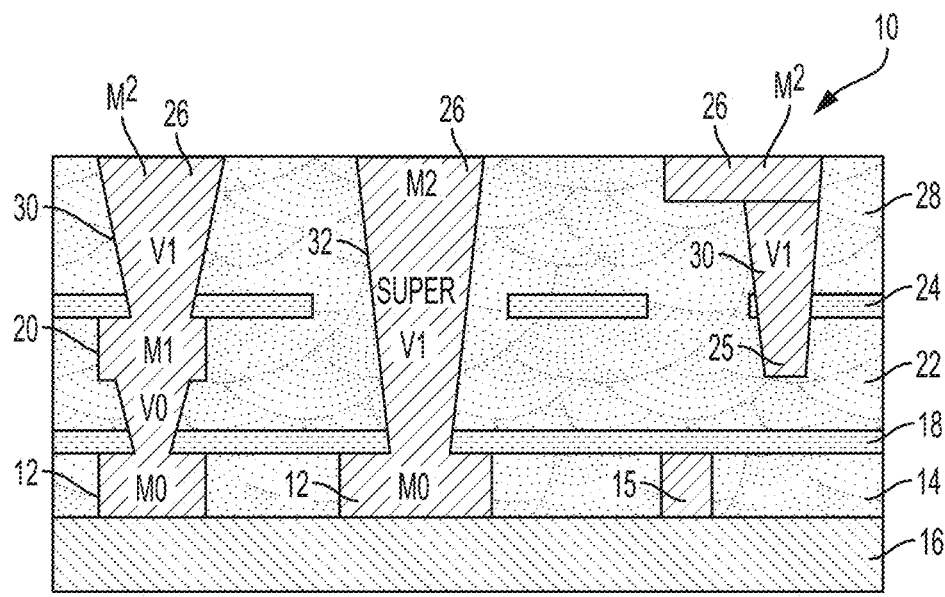
FIG. 1 is a sectional view depicting a semiconductor device after a fabrication operation according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Moreover, numerous specific details are set forth in the following description, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention. Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing. A super via structure is generally defined as a vertical electrical connection (via) spanning two metal layers without a landing pad on an intermediate metal layer, i.e., a double height via, that is formed during BEOL processing. The formation of super via structures is beneficial in that these types of structures can be used to minimize capacitance, which is highly desirable as integrated circuits scale down to smaller dimensions. Some of the challenges in forming the super vias structures are that a high aspect ratio etch recipe is required and that the filling of the resulting vias is through multiple materials present in a stack.

An exemplary semiconductor device 10 including a super via is depicted in FIG. 1. The semiconductor device 10 includes a first interconnect level including a metal conductor 12 lithographically formed within a layer of dielectric material 14 and disposed on a substrate 16, wherein the substrate can include one or more devices that make up the integrated circuit formed during the front end of line processing (FEOL). The metal conductor 12 can be copper, aluminum, a combination thereof, or the like. The metal conductor 12 in the first interconnect level on the substrate is typically referred to as metal-0 (M0). The first interconnect level can further include overlay alignment markers 15 formed of a metal conductor, one of which is shown, which are high precision features that are used as the reference when positioning subsequent patterns to the first pattern. A dielectric nitride capping layer 18 such as silicon carbon nitride is provided on the first interconnect level. The semiconductor device 10 further includes a second interconnect level including metal conductor 20 (i.e., M1) lithographically formed within a layer of dielectric material 22 on the dielectric nitride capping layer 18.

As shown, the second interconnect level further includes at least one metal conductor filled via (V0) 22 vertically extending from and electrically coupling the patterned metal (M1) 20 to the underlying patterned metal (M0) 12. The second interconnect level can further include one or more alignment markers 25. A dielectric nitride capping layer 24 such as silicon carbon nitride is disposed on the second interconnect level. The semiconductor device 10 further includes a third interconnect level including metal conductor 26 (i.e., M2) lithographically formed within a layer of dielectric material 28 disposed on the dielectric capping layer 24. The third interconnect level further includes vias 30 (i.e., V1) vertically extending from and electrically coupling metal conductor 30 (M2) to metal conductor 20 (M1). Additionally, the structure 10 includes a super via 32 vertically extending from and electrically coupling the metal conductor 26 (M2) to metal conductor 12 (M1). As such, the super via 32 spans two interconnect levels (i.e., M2 to M0), without a landing pad on an intermediate metal layer (M1). In contrast, the vias, e.g., 22, 30, span a single interconnect level. Consequently, the super via 32 is twice the height of vias 22, 30.

The dielectric materials within the semiconductor device 10 can be the same and can be a low k dielectric material having a dielectric constant (k value) less than 3.9. The dielectric materials can be silicon containing or non-silicon containing.

Figure 2:
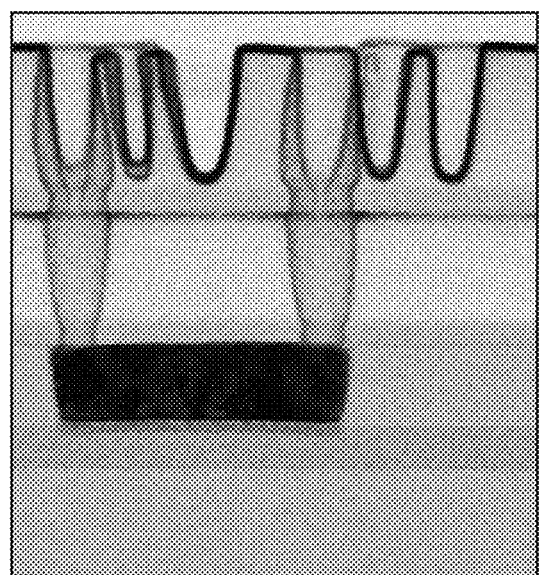
FIG. 2 is a scanning electron micrograph depicting a semiconductor device after a prior art fabrication operation.
Figure 3:
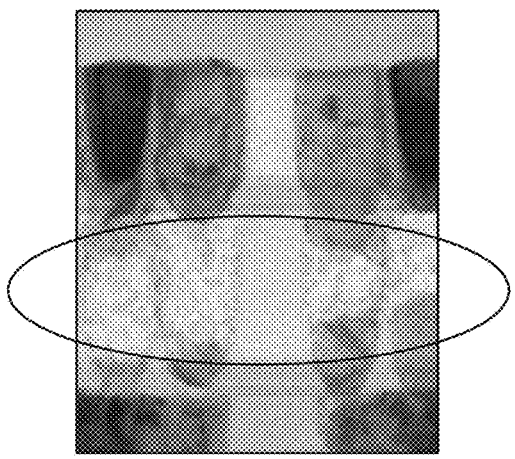
FIG. 3 is a sectional view depicting a semiconductor device after a prior art fabrication operation.

One of the problems with current processes of record is that a necking profile can occur during formation of the super via at about a transition between dielectric material 28 and dielectric material 22, i.e., the transition between interconnect levels. The processes of record generally employ a high aspect ratio reactive ion etch recipe to etch dielectric material 28, capping layer 24, and dielectric material 22 in a single step. The etching of the dielectric materials is relatively fast and constant compared to the capping layer, which has a slower etch rate and is believed to contribute to the necking profile. FIGS. 2 and 3 illustrate a super via profile processed using the prior art processes of record, which, as noted above, generally included a high aspect ratio reactive ion etch recipe to etch dielectric material 28, capping layer 24, and dielectric material 22 in a single step. FIG. 2 is illustrative of the super via profile before the metal filling and FIG. 3 is illustrative of the super via profile subsequent to metal filling. As is clearly evident, the necking profile of the super via is clearly evident at the transition between the dielectric materials and the subsequent metal filling at the bottom of the super via is incomplete. Still further, in addition to the problems noted above, the presence of multiple nitride layers, which are fairly opaque under visible light, can cause problems during mask overlay as it can be more difficult to find the alignment markers.

Turning now to a more detailed description of aspects of the present invention, FIGS. 4-10 illustrate a process to fabricate a super via structure in accordance with one or more embodiments of the present invention. The process generally includes providing a new mask patterning step to remove selected portions of the dielectric nitride capping layer utilized between interconnect levels such that high aspect ratio etching to form the super via structure is through the layers of dielectric material only. Additionally, the selected portions of the capping layer that are removed can provide improved visibility to the alignment markers for improved overlay tolerances.

Figure 4:
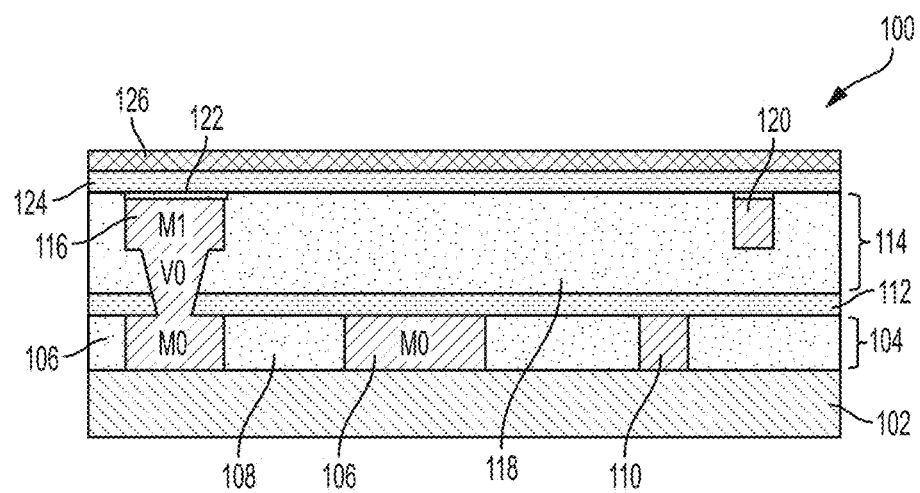
FIG. 4 is a sectional view depicting a semiconductor device after a hardmask formation and deposition fabrication operation according to embodiments of the invention.

FIG. 4 depicts a typical stack build structure 100 upon which a super via can be integrated, wherein the depicted structure is subsequent to formation of the initial patterned metal layer (M0), an additional patterned metal layer (M1) and a normal height via (V0) vertically extending and electrically coupling M1 to M0. As such, the structure 100 includes a substrate 102, which can include one or more desired devices formed during the front end of line processing. A first interconnect level 104 is provided on the substrate 102. The first interconnect level 104 includes the patterned metal 106 (M0) lithographically formed within a dielectric material 108 using a process such as a damascene process. The first interconnect level 104 further includes one or more overlay markers 110. The first layer 104 has a planar top surface upon which there is shown a dielectric nitride cap layer 112, which also has a planar top surface. The dielectric nitride cap layer 112 serves to inhibit the diffusion of copper, which typically employs a nitride such as silicon carbon nitride, silicon nitride, or the like.

A second interconnect level 114 is formed on the dielectric cap layer 112. The second interconnect level 114 includes patterned metal lines 116 (M1) lithographically formed within a dielectric material 118. The second interconnect level 104 further includes one or more overlay markers 120. A cobalt cap 122 can be provided on the upper most surface of the patterned metal lines and the overlay marker. A via (V0), which is at a normal height, vertically extends from and electrically couples the patterned metal (M1) 116 to the underlying patterned metal (M0) 106. The second interconnect level 114 has a planar surface upon which there is shown a dielectric cap layer 124. The dielectric cap can be a nitride based material such as a silicon carbon nitride material, silicon nitride, or the like. An oxide hardmask 126 is provided on the dielectric cap layer 124.

The first and second interconnect levels can be formed by conventional damascene processes.

The dielectric cap layers 112, 124 are formed of a nitride based material such as, for example, silicon nitride, silicon carbon nitride material, or the like. The thickness of the nitride cap layer can be about 5 nm to 200 nm.

The dielectric materials 108, 118 can be a low k dielectric material such as, but not limited to, inorganic dielectrics or organic dielectrics. The dielectric material can be porous or non-porous. Porous dielectric materials generally have a lower dielectric constant than the non-porous counterparts. Some examples of suitable dielectrics that can be used as the low k dielectric material include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the low k dielectric material has a dielectric constant (k value) that is about 3.9 or less. In one or more other embodiments, the dielectric material has a dielectric constant of about 2.8 or less. In one or more other embodiments, the dielectric material has a dielectric constant of about 2.4 to 2.7. All dielectric constants mentioned in this detailed description are relative to a vacuum unless otherwise noted. Dielectrics having a dielectric constant of about 3.9 or less generally have a lower parasitic crosstalk as compared with dielectric materials that have a higher dielectric constant. The thickness of the dielectric material can vary depending upon the device dimensions. Generally, the dielectric material can be at a thickness of 10 nanometers (nm) to 1000 nm.

Figure 5:
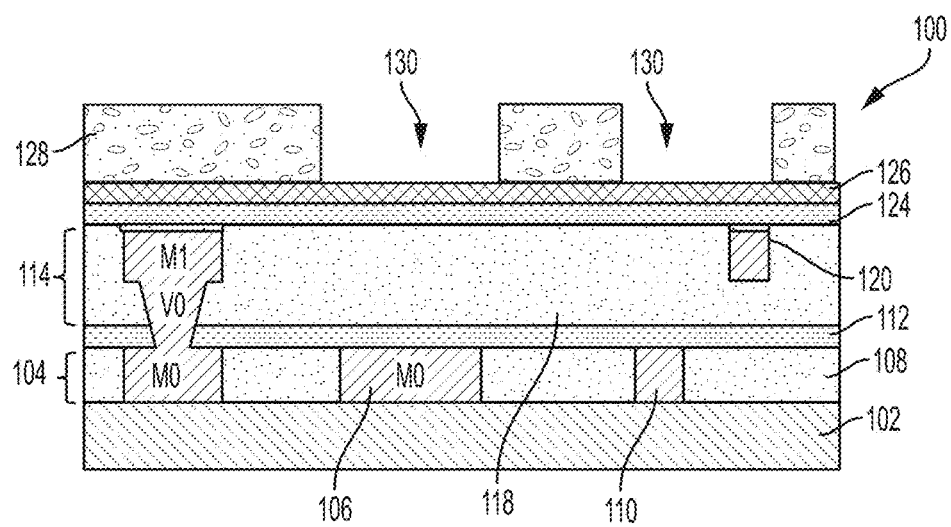
FIG. 5 is a sectional view depicting a semiconductor device after a lithography with a block or cut mask fabrication operation according to embodiments of the invention.
Figure 6:
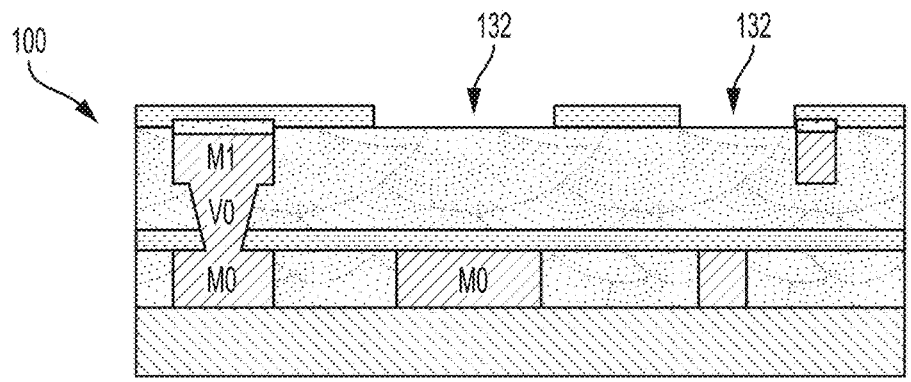
FIG. 6 is a sectional view depicting a semiconductor device after an open hardmask fabrication operation according to embodiments of the invention.

Turning now to FIGS. 5-6, there is shown the structure 100 subsequent to photolithography with a block or cut mask to selectively remove portions of the cap layer 124 and form windows to the underlying features. Photolithography can include utilizing a multilayer patterning scheme such as a trilayer scheme. Exemplary trilayer schemes generally include a photoresist, a silicon-containing hardmask underlying the photoresist, and an organic dielectric layer underlying the silicon-containing hardmask and overlying a substrate to be patterned. Patterning of the silicon-containing hardmask and organic dielectric layer typically includes reactive ion etch (RIE) chemistry. In particular, the silicon-containing hardmask and the underlayer are generally configured to provide alternating etch selectivities towards fluorine- and oxygen-containing RIE chemistry to allow for highly selective pattern transfer from the photoresist on top of the silicon-containing hardmask into the oxide hardmask and capping layer below the underlayer. In some embodiments, a reductive RIE chemistry can be used, e.g., $N_2/H_2$. FIG. 5 depicts the openings 130 formed in the trilayer 128. The openings generally correspond to location of the super via to be formed and provides a window to the underlying overlay marker 110.

Multilayer patterning schemes such as the above noted trilayer scheme can enable the extension of KrF/248 nm, ArF/193 nm and EUV photolithography by increasing the numerical aperture (NA) of the exposure system. The result is a smaller depth of focus, subsequently requiring the use of thinner photoresists.

In FIG. 6, the openings 130 formed during the trilayer scheme patterning are transferred into the dielectric cap layer 124 via an etch process so as to provide openings 132 therein. The etching process can be a dry etch (e.g., reactive ion etching, plasma etching, ion beam etching, or laser ablation) and/or a wet chemical etch (e.g., potassium hydroxide (KOH)). After transferring the pattern, the patterned photoresist is removed utilizing resist stripping processes, for example, ashing. The openings 132 generally correspond to where the super via structure will be formed and where underlying alignment markers can be present.

Optionally, the exposed layer of dielectric material 118 is subjected to surface treatment in order to improve adhesion with a subsequent layer of dielectric material. Surface treatment can include exposing the surface to plasma, ultraviolet light, o-zone, or the like.

Figure 7:
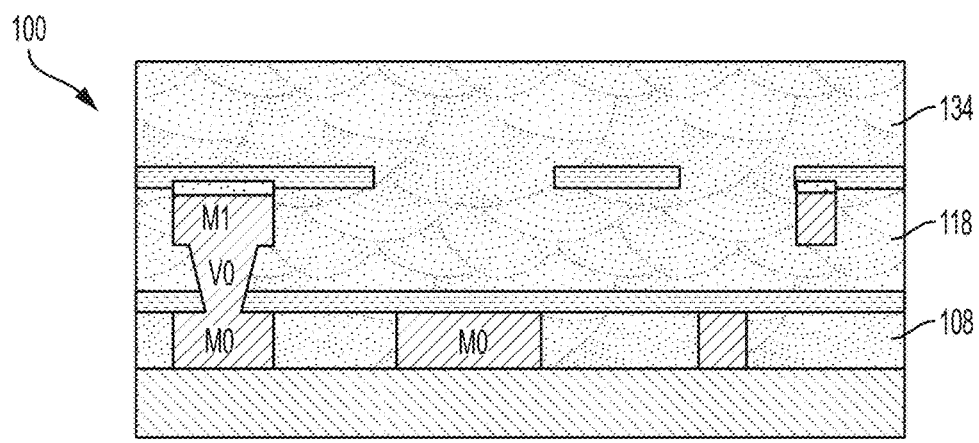
FIG. 7 is a sectional view depicting a semiconductor device after a dielectric refill fabrication operation according to embodiments of the invention.

In FIG. 7, a third interconnect level 141 is formed by first depositing a layer of dielectric material onto the structure. The surface of the dielectric material can be subject to a chemical mechanical planarizing (CMP) process so as to planarize the top surface thereof. The CMP process generally includes a rotating polishing platen and a wafer holder, which can both exert a force on the wafer and rotate the wafer independent of the rotation of the platen. A chemical reagent accompanies the polishing such that any topography is removed and the surface is planarized. The chemical reagent used in chemical mechanical polishing is known as polishing slurry. The polishing slurry consists of colloidal silica or dispersed alumina in an alkaline potassium hydroxide (KOH) or ammonium hydroxide ($NH_4OH$) solution. The basic polishing mechanism for polishing a material on a wafer includes chemically altering the material to be polished and removing the chemically altered material based on the mechanical abrasion of the slurry. The dielectric material in layer 134 is the same as the dielectric material used in layers 108 and 118.

Figure 8:
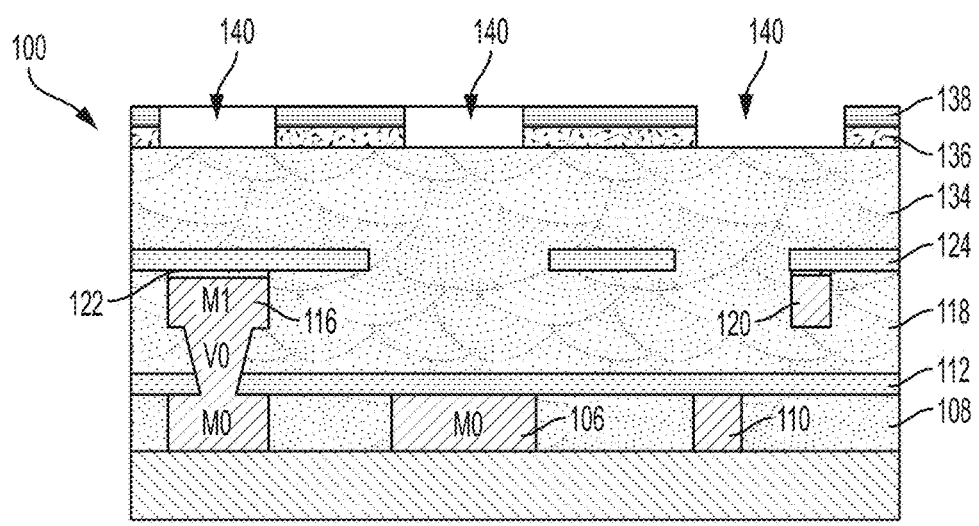
FIG. 8 is a sectional view depicting a semiconductor device after an optional surface treatment fabrication operation according to embodiments of the invention.

Referring now to FIG. 8, a double hardmask including a silicon nitride layer 136 and a titanium nitride layer 138 are sequentially deposited onto the planarized surface of the layer of dielectric material 134. The thickness of the silicon nitride layer or the titanium nitride layer can be between 1 Angstrom and 1000 Angstroms or more. In one or more embodiments, the thickness of the silicon nitride or the titanium nitride layer is 10 Angstroms to 500 Angstroms, and in still one or more other embodiments, the thickness of the silicon nitride layer or titanium nitride layer is 25 to 200 Angstroms. By way of example, the silicon nitride layer or the titanium nitride layer can be 100 Angstroms. In one or more embodiments, the silicon nitride layer and the titanium nitride layer can have different thicknesses.

The silicon nitride layer 136 and the titanium nitride layer 138 are then lithographically patterned to form openings 140, which generally correspond to the underlying patterned metal layer 116 (M1) and alignment marker 120 in layer 114, and the underlying patterned metal layer 106 (M0) to which the super via structure will be electrically coupled thereto and the underlying alignment marker 110 present in the first layer 104. A multilayer patterning scheme such as the trilayer scheme described above can be used to form the openings 140.

Figure 9:
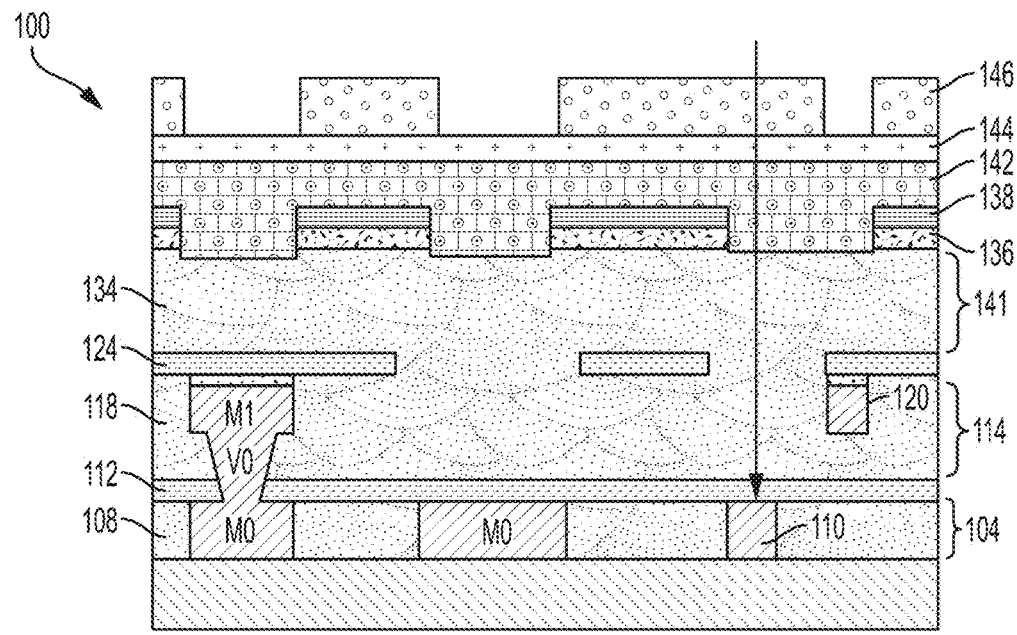
FIG. 9 is a sectional view depicting a semiconductor device after a fabrication operation according to embodiments of the invention.

In FIG. 9, a multilayer patterning scheme is used to form the various vias in the third interconnect level 141. An exemplary patterning scheme includes forming a trilayer of organic planarizing layer (OPL) 142, silicon anti reflective coating (SiARC) 144, and a photoresist 146 onto at least the dielectric surfaces where openings are desired, exposing the photoresist to a pattern of activating radiation, and then developing the exposed photoresist with a resist developer to provide a patterned photoresist. At least one etch process can be employed to transfer the pattern from the patterned photoresist into the dielectric layer 134. The etching process can be a dry etch (e.g., reactive ion etching, plasma etching, ion beam etching, or laser ablation) and/or a wet chemical etch (e.g., potassium hydroxide (KOH)). A reactive ion etching process can be used to form the various via structures stopping on the corresponding nitride layer. Advantageously, the overlay alignment marker 110 is readily visible since only one nitride layer 112 is in the optical path.

Figure 10:
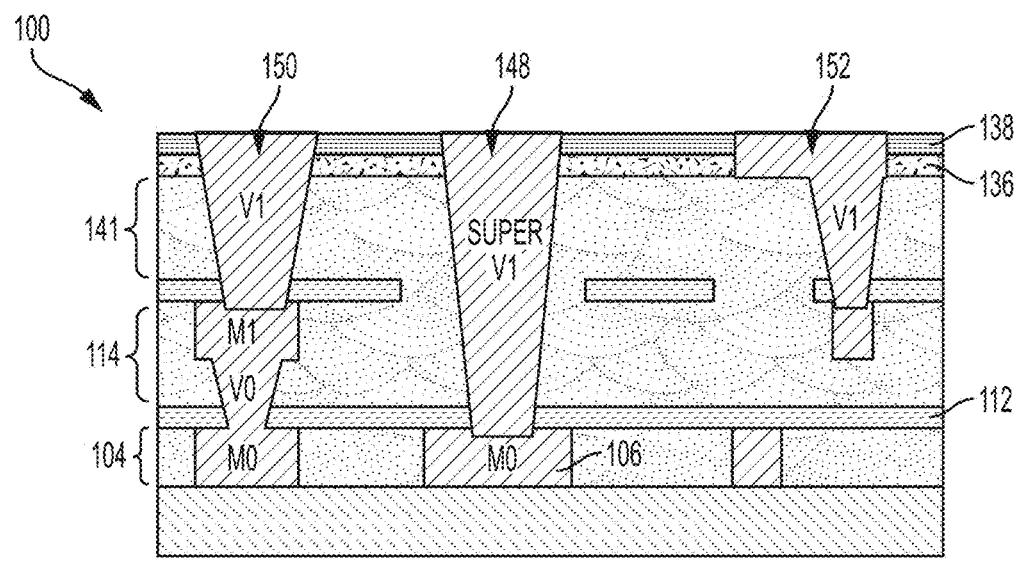
FIG. 10 is a sectional view depicting a semiconductor device after a fabrication operation according to embodiments of the invention.

In FIG. 10, the resulting via structures subsequent to etching are depicted. The super via structure 148 (i.e., super via 1) terminates on the underlying metal 106 (M0) and is at a double height spanning two interconnect levels 104, 114 relative to the other (V1) vias 150, 152, which span the height of third interconnect level 141.

The hardmask layers 136, 138 are then removed and a metal liner layer, i.e., barrier layer, conformally deposited. For example, tantalum, tantalum nitride, cobalt, ruthenium, titanium nitride, and combinations of more than one material (for example tantalum nitride/tantalum or tantalum nitride/cobalt). The presence of the barrier layer such as titanium nitride, for example, insures that copper, which is participating in the interdiffusion during subsequent annealing processes, will not further diffuse into underlying dielectric layers.

Next, an optional conformal seed layer is deposited. The function of the seed layer is to provide a base upon which a copper conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of copper is then deposited. In some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The copper layer can be formed by CVD, sputtering, electrochemical deposition or like processes. For example, the deposition of copper can proceed by electrochemical deposition such as electroplating or electroless plating. Examples of suitable copper electroplating compositions are described in U.S. Pat. No. 6,911,229 assigned to International Business Machines Corporation, the entire description of which is incorporated by reference in its entirety.

Following formation of copper metal layer, the substrate is subjected to a planarization process to remove any copper overburden such that a top surface of the copper is substantially coplanar to the low k dielectric layer as was previously shown in FIG. 1. For example, the surface can be planarized using an electropolishing process. In an electropolishing process small amounts of copper are etched from the copper by electroetch or electrochemical etching to provide a copper interconnect having a top copper surface generally coplanar to the top surface of the dielectric. Such a structure is often referred to as a recessed structure. In another embodiment, the planar surface is formed by chemical-mechanical-polishing (CMP), using a non-selective slurry composition. The slurry composition contains a silica abrasive material, which removes the different metal layers at substantially the same rate. Alternatively, a planar surface can be formed by a non-selective plasma etching process. The plasma etching process can include additional planarizing layers deposited onto copper layer. For example, a layer of photoresist can be deposited onto copper layer prior to performing the non-selective etch process.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

It is also to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A process of fabricating a semiconductor device including a super via interconnect structure, the process comprising:
    providing a structure including a first interconnect level, a second interconnect level, a first nitride cap layer intermediate the first and second interconnect levels, and a second nitride cap on the second interconnect level;
    removing selected portions of the second nitride cap layer to expose portions of a dielectric material in the second interconnect level, wherein underlying the exposed portions of the dielectric material in the second interconnect level comprise a first metal conductor and a metal alignment marker;
    depositing a layer of dielectric material onto the second interconnect level to form a third interconnect level, wherein the dielectric material in the third interconnect level is the same as the dielectric material in the second interconnect level;
    patterning the layer of dielectric material in the third interconnect level to form via structures spanning the third interconnect level to the metal conductor and the metal alignment marker in the second interconnect level and patterning the layer of dielectric material in the third interconnect level and the layer of dielectric material in the second interconnect level to form a super via structure to the metal conductor in the first interconnect level; and
    filling the super via structure and the via structures with a metal conductor.

2. The process of claim 1, wherein patterning the layer of dielectric material in the third interconnect level and patterning the layer of dielectric material in the third interconnect level and the layer of dielectric material in the second interconnect level is simultaneous.

3. The process of claim 1, wherein the metal conductor is copper.

4. The process of claim 1, wherein the nitride cap layer is silicon nitride.

5. The process of claim 1, wherein patterning the layer of dielectric material in the third interconnect level and patterning the layer of dielectric material in the third interconnect level and the layer of dielectric material in the second interconnect level comprises depositing a hard mask onto the third interconnect level comprising titanium nitride and silicon nitride; removing selected portions of the hardmask; and reactive ion etching to form the via structures and the at least one super via structure.

6. The process of claim 1, further comprising treating a surface of the exposed portions of the dielectric material in the second interconnect level.

7. The process of claim 6, wherein treating the surface comprises exposing the surface to plasma, ozone, ultraviolet light, or combinations thereof for an amount effective to increase adhesion of the third interconnect level to the exposed portions of the dielectric material in the second interconnect level.

8. A semiconductor device including a super via structure, the device comprising:
    a plurality of interconnect levels comprising a metal conductor formed in a dielectric layer, wherein each of the interconnect levels is separated from an adjacent interconnect level with a nitride cap layer
    a plurality of via structures formed electrically couple the metal conductor in a selected interconnect level with the metal conductor in the adjacent interconnect level; and
    at least one super via structure spans two of the plurality of interconnect levels without a landing pad on an intermediate interconnect level, wherein the at least one super via structure is free of a necking profile, has a height that is twice that of the via structure, and has a tapered profile the same as the via structure.

* * * * *